United States Patent
Mitani et al.

(10) Patent No.: US 9,118,326 B2
(45) Date of Patent: Aug. 25, 2015

(54) OUTPUT CIRCUIT, TEMPERATURE SWITCH IC, AND BATTERY PACK

(75) Inventors: Masahiro Mitani, Chiba (JP); Naohiro Hiraoka, Chiba (JP); Masakazu Sugiura, Chiba (JP); Atsushi Igarashi, Chiba (JP)

(73) Assignee: SEIKO INSTRUMENTS INC., Chiba (JP)

( * ) Notice: Subject to any disclaimer, the term of this patent is extended or adjusted under 35 U.S.C. 154(b) by 736 days.

(21) Appl. No.: 13/355,740

(22) Filed: Jan. 23, 2012

(65) Prior Publication Data
US 2012/0187911 A1 Jul. 26, 2012

(30) Foreign Application Priority Data
Jan. 25, 2011 (JP) ................................ 2011-013326

(51) Int. Cl.
| H02J 7/00 | (2006.01) |
| H03K 17/20 | (2006.01) |
| H02J 7/04 | (2006.01) |
| H03K 19/00 | (2006.01) |
| H03K 19/0185 | (2006.01) |
| H03K 19/003 | (2006.01) |

(52) U.S. Cl.
CPC .............. *H03K 17/20* (2013.01); *H02J 7/0031* (2013.01); *H02J 7/047* (2013.01); *H03K 19/0013* (2013.01); *H03K 19/00361* (2013.01); *H03K 19/018521* (2013.01)

(58) Field of Classification Search
USPC .......... 320/134; 327/108, 513, 112, 170, 379, 327/109; 326/81, 83, 71, 121, 22; 323/315
See application file for complete search history.

(56) References Cited

U.S. PATENT DOCUMENTS

| 4,791,323 | A | * | 12/1988 | Austin ............................ 326/71 |
| 5,117,131 | A | * | 5/1992 | Ochi et al. ....................... 326/71 |
| 5,406,139 | A | * | 4/1995 | Sharpe-Geisler ................ 326/71 |
| 6,069,491 | A | * | 5/2000 | Muller et al. .................... 326/70 |
| 6,351,158 | B1 | * | 2/2002 | Shearon et al. ................ 327/108 |
| 6,362,655 | B1 | * | 3/2002 | Abraham et al. ................ 326/83 |
| 7,598,779 | B1 | * | 10/2009 | Wang et al. ................. 327/108 |
| 8,018,268 | B1 | * | 9/2011 | Williams ....................... 327/534 |
| 2007/0236252 | A1 | * | 10/2007 | Matsumoto et al. ............ 326/81 |
| 2008/0018363 | A1 | * | 1/2008 | Moriwaki ...................... 327/108 |
| 2009/0091986 | A1 | * | 4/2009 | Bringivijayaraghavan et al. ......................... 365/189.05 |
| 2009/0189668 | A1 | | 7/2009 | Morino |
| 2011/0001513 | A1 | * | 1/2011 | Utsunomiya .................... 326/81 |
| 2012/0032939 | A1 | * | 2/2012 | Tsuchi ........................... 345/211 |

FOREIGN PATENT DOCUMENTS

| JP | 02-210913 A | 8/1990 |
| JP | 06-075668 A | 3/1994 |
| JP | 11-201830 A | 7/1999 |
| JP | 2005-260868 A | 9/2005 |

\* cited by examiner

*Primary Examiner* — Edward Tso
*Assistant Examiner* — Alexis A Boateng
(74) *Attorney, Agent, or Firm* — Brinks Gilson & Lione

(57) ABSTRACT

An output circuit has a smaller area and restrains outputs from becoming unstable even if a power supply voltage is lower than an operating voltage. A supply terminal of an inverter circuit is provided with switch circuit, and the switch circuit stops the operation of the inverter circuit when the power supply voltage is lower than the operating voltage of the circuit. Further, the output terminal of the inverter circuit is provided with a current source to fix the output to the power supply voltage when the operation of the inverter circuit is stopped.

5 Claims, 4 Drawing Sheets

OUTPUT CIRCUIT, TEMPERATURE SWITCH IC, AND BATTERY PACK

RELATED APPLICATIONS

This application claims priority under 35 U.S.C. §119 to Japanese Patent Application No. 2011-013326 filed on Jan. 25, 2011, the entire content of which is hereby incorporated by reference.

BACKGROUND OF THE INVENTION

1. Field of the Invention

The present invention relates to an output circuit, the output of one end of which has high impedance and, more particularly, to an output circuit which stably operates when a power supply voltage is low. The present invention further relates to a temperature switch IC and a battery pack, each of which is provided with the aforementioned output circuit.

2. Description of the Related Art

The following will describe a conventional output circuit. FIG. 7 is a circuit diagram illustrating a conventional output circuit.

The conventional output circuit includes an inverter 97 connected to an input terminal, an NMOS transistor 93, which is an output driver, a diode-connected NMOS transistor 95 and a capacitor 96, which are provided between a power source and the ground, and an NMOS transistor 94 controlled thereby.

When the circuit is turned on, a power supply voltage VDD gradually rises. The NMOS transistor 95 remains nonconductive while the power supply voltage VDD is lower than a threshold voltage Vthn 95. The NMOS transistor 94 turns off, because the gate voltage thereof becomes an earth voltage VSS due to the capacitor 96. Hence, the output terminal of the output circuit is in a high-impedance state. This ensures that the output terminal of the output circuit is always set in the high-impedance state if the power supply voltage VDD at the time of, for example, turning the circuit on, is lower than a minimum operating voltage of the circuit.

When the power supply voltage VDD exceeds the threshold voltage Vthn 95 of the NMOS transistor 95, the NMOS transistor 95 becomes conductive. The capacitor 96 is charged by the current supplied by the NMOS transistor 95. When the gate voltage thereof gradually rises and exceeds a threshold voltage, the NMOS transistor 94 turns on. When the NMOS transistor 94 turns on, the function of the NMOS transistor 93 is rendered valid, transmitting an output of the inverter 97 to the output terminal. If the voltage of an input terminal of the output circuit is at a low level, then the NMOS transistor 93 turns on, and an output voltage VOUT of the output terminal becomes the earth voltage VSS. If the voltage at the input terminal of the output circuit is at a high level, then the NMOS transistor 93 turns off, causing the output voltage VOUT of the output terminal to be set in the high-impedance state (refer to, for example, patent document 1).

[Patent Document 1] Japanese Patent Application Laid-Open No. 06-075668

In the conventional output circuit, the NMOS transistor 94 is provided in series with the NMOS transistor 93. The NMOS transistor 93, which is an output driver, is required to provide a drive capability. For this reason, a large NMOS transistor is used for the transistor 93. Thus, the NMOS transistor 94 is required to provide a drive capacity that is equivalent to or higher than that of the NMOS transistor 93.

The conventional output circuit has been posing a problem that the large size of the NMOS transistor 94 inconveniently leads to a large area of the output circuit.

SUMMARY OF THE INVENTION

The present invention has been made in view of the problem described above, and an object of the invention is to provide an output circuit with a smaller area.

To this end, the present invention provides an output circuit with open-drain output including: an inverter circuit connected to an input terminal of the output circuit; an output MOS transistor having a gate thereof connected to an output terminal of the inverter circuit; a drain thereof connected to an output terminal of the output circuit, and a source thereof connected to a first supply terminal; a switch circuit provided between the inverter circuit and a second supply terminal; and a current source provided between the gate of the output MOS transistor and the first supply terminal, wherein the switch circuit turns off when a power supply voltage is lower than a minimum operating voltage of the output circuit.

The output circuit according to the present invention is configured such that, if a power supply voltage is lower than an operating voltage of the circuit, then the operation of the inverter is interrupted and the gate of an output driver is controlled to turn it off. Hence, a large MOS transistor is no longer required to be provided between the source of the output driver and a power source. This arrangement enables the output circuit to restrain unstable outputs even when the power supply voltage is lower than the operating voltage and to achieve a reduced area.

DETAILED DESCRIPTION OF THE PREFERRED EMBODIMENTS

Embodiments of the present invention will be described below with reference to the accompanying drawings.

Figure 1:
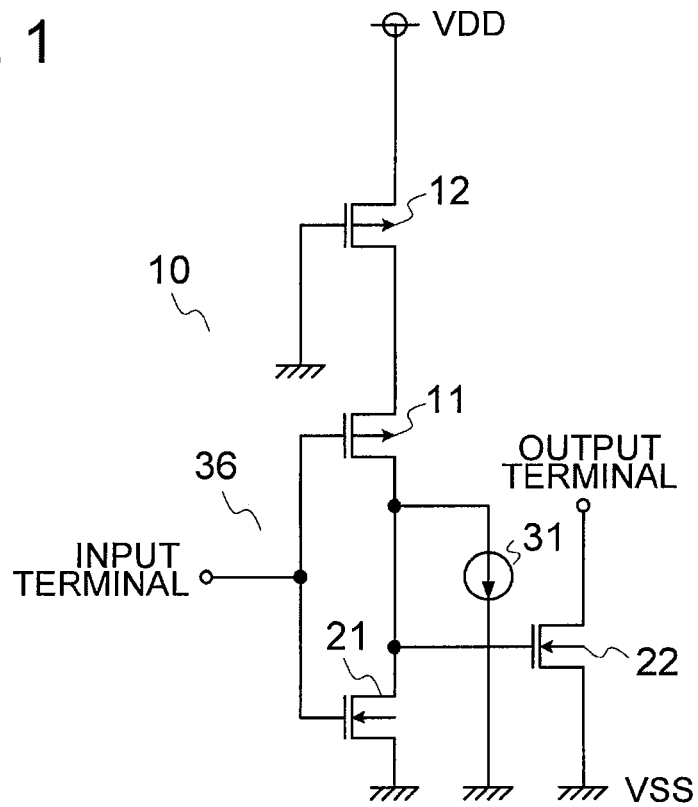
FIG. 1 is a circuit diagram illustrating an example of the output circuit according to an embodiment of the present invention.

FIG. 1 is a circuit diagram illustrating an output circuit according to an embodiment of the present invention.

An output circuit 10 has PMOS transistors 11 and 12, NMOS transistors 21 and 22, and a current source 31.

The PMOS transistor 11 has the gate thereof connected to the input terminal of the output circuit 10, the source thereof connected to the drain of the PMOS transistor 12, and the drain thereof connected to the gate of the NMOS transistor 22. The NMOS transistor 21 has the gate thereof connected to the input terminal of the output circuit, the source thereof connected to an earth terminal (a power supply terminal at an earth voltage side), and the drain thereof connected to the gate of the NMOS transistor 22. The PMOS transistor 12 has the gate thereof connected to the earth terminal and the source thereof connected to a supply terminal (the power supply terminal at a power supply voltage side). The PMOS transistor 12 is provided on a power supply line of an inverter 36 composed of the PMOS transistor 11 and the NMOS transistor 21.

The current source 31 is provided between the drain of the PMOS transistor 11 and the earth terminal. The NMOS transistor 22 has the source thereof connected to the earth terminal and the drain thereof connected to the output terminal of the output circuit 10. The NMOS transistor 22 is an open-drain output driver.

The absolute value |Vthp12| of the threshold voltage of the PMOS transistor 12 is higher than the absolute value |Vthp11| of the threshold voltage of the PMOS transistor 11 and indicates the minimum operating power supply voltage of the output circuit 10. If a power supply voltage VDD is lower than the minimum operating power supply voltage, then the PMOS transistor 12 turns off so as not to supply the power supply voltage VDD to the inverter 36. Further, the current source 31 turns the NMOS transistor 22 off.

The operation of the output circuit 10 will now be described.

When the power is turned on, the power supply voltage rises. At this time, if the power supply voltage VDD is lower than the absolute value |Vthp12| of the threshold voltage of the PMOS transistor 12, then the PMOS transistor 12 turns off. This prevents the power supply voltage VDD from being supplied to the inverter 36. Therefore, the output terminal of the inverter 36 is pulled down by the current source 31, so that the output voltage of the inverter 36 is an earth voltage VSS. The NMOS transistor 22, which is the output driver, turns off because the gate voltage thereof becomes the earth voltage VSS, thus setting the output terminal of the output circuit 10 in the high impedance state. Hence, the output terminal of the output circuit 10 is pulled up to the power supply voltage of a circuit in a subsequent stage, the aforementioned output terminal being connected to the input terminal of the circuit in the subsequent stage. This arrangement restrains the circuit in the subsequent stage from malfunctioning.

If the power supply voltage VDD becomes higher than the absolute value |Vthp12| of the threshold voltage of the PMOS transistor 12, then the PMOS transistor 12 turns on. This causes the power supply voltage VDD to be supplied to the inverter 36.

If the voltage at the input terminal of the output circuit 10 is a low level, then the gate voltage of the NMOS transistor 22 becomes a high level due to the inverter 36, causing the NMOS transistor 22 to turn on and the output voltage VOUT to become the earth voltage VSS. The current source 31 is designed to have a drive capability that is lower than the drive capability of the PMOS transistor 11.

If the voltage at the input terminal of the output circuit 10 becomes a high level, then the gate voltage of the NMOS transistor 22 becomes a low level due to the inverter 36. This causes the NMOS transistor 22 to turn off, placing the output terminal of the output circuit 10 in the high-impedance state.

The output circuit according to the present embodiment is configured such that, when the power supply voltage is lower than the operating voltage of the circuit, the operation of the inverter is interrupted and the gate of the output driver is turned off by the current source, thus obviating the need for providing a large MOS transistor between an output driver and a power source. This permits a reduced area of the output circuit 10.

Further, if the power supply voltage VDD at the time of, for example, turning the power on, is lower than the minimum operating power supply voltage of the output circuit 10, then the output voltage VOUT always causes high impedance, thus restraining a circuit in a subsequent stage from malfunctioning.

Figure 2:
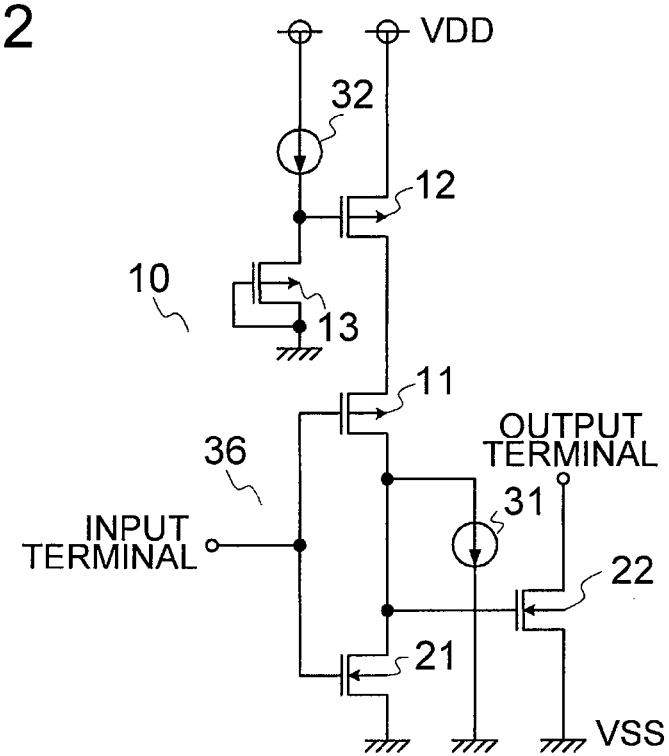
FIG. 2 is a circuit diagram illustrating another example of the output circuit according to the embodiment.

FIG. 2 is a circuit diagram illustrating another example of the output circuit according to the present embodiment. The output circuit 10 in FIG. 2 further includes a current source 32 and a PMOS transistor 13.

The PMOS transistor 13 and the current source 32 are connected in series between a supply terminal and an earth terminal. The PMOS transistor 13 has the gate and the drain thereof connected to the earth terminal. The connection point of the current source 32 and the source of the PMOS transistor 13 is connected to the gate of the PMOS transistor 12.

According to the configuration described above, the minimum operating power supply voltage of the output circuit 10 is set by the current source 32 and the two PMOS transistors 12 and 13. More specifically, when a power supply voltage VDD becomes higher than the total voltage of the absolute values of the threshold voltages of the two PMOS transistors 12 and 13, the PMOS transistor 12 is turned on and the power supply voltage VDD is supplied to an inverter 36.

At the output end in FIG. 2, the diode-connected PMOS transistor 13 is provided between the gate of the PMOS transistor 12 and the earth terminal. Alternatively, however, a diode-connected NMOS transistor may be provided instead of the PMOS transistor 13.

Figure 3:
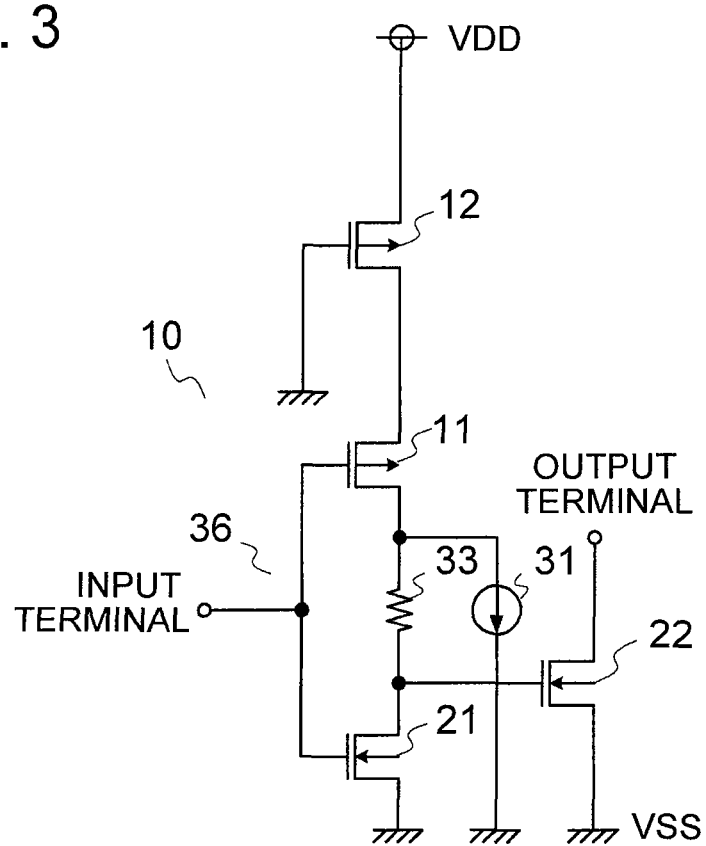
FIG. 3 is a circuit diagram illustrating still another example of the output circuit according to the embodiment.

FIG. 3 is a circuit diagram illustrating another example of the output circuit according to the present embodiment. As illustrated in FIG. 3, the gate of the NMOS transistor 22 may be connected to the drain of the PMOS transistor 11 through the intermediary of a resistor 33.

In the aforementioned configuration, a low-pass filter is constituted by the resistor 33 and the capacitor between the gate and the source of the NMOS transistor 22, thus reducing the malfunctions of the NMOS transistor 22 caused by a surge. The gate of the NMOS transistor 22 may be connected to the connection point of the resistor 33 and the drain of the NMOS transistor 21.

In the output circuit shown in FIG. 1, the NMOS transistor for controlling the supply of the power supply voltage VDD to the inverter 36 may be provided between the inverter 36 and the earth terminal. Further, in FIG. 1, the open-drain NMOS transistor 22 is used, and the output voltage VOUT becomes the high impedance state in the case where the power supply voltage VDD is lower than the minimum operating power supply voltage of the output circuit 10. However, although not shown, an open-drain PMOS transistor may alternatively be used. At this time, the gate of the NMOS transistor for controlling the supply of the power supply voltage VDD to the inverter 36 is connected to a supply terminal, the source thereof is connected to an earth terminal, and the drain thereof is connected to the source of the NMOS transistor 21. The gate of the open-drain PMOS transistor is connected to the output terminal of the inverter 36, the source thereof is connected to the supply terminal, and the drain thereof is connected to the output terminal of the output circuit 10. The current source 31 is provided between the supply terminal and the output terminal of the inverter 36.

When the power supply voltage VDD becomes higher than the threshold voltage Vthn of the NMOS transistor, the NMOS transistor turns on and the power supply voltage VDD is supplied to the inverter 36.

If the power supply voltage VDD is lower than the absolute value |Vthp12| of the threshold voltage of the PMOS transistor 12, then the PMOS transistor 12 turns off. Thus, the power supply voltage VDD is not supplied to the inverter 36. Hence, the output terminal of the inverter 36 is pulled up by the current source 31, so that the output voltage of the inverter 36 becomes the power supply voltage VDD. The PMOS transistor turns off, and the output voltage VOUT becomes the high impedance state.

Figure 4:
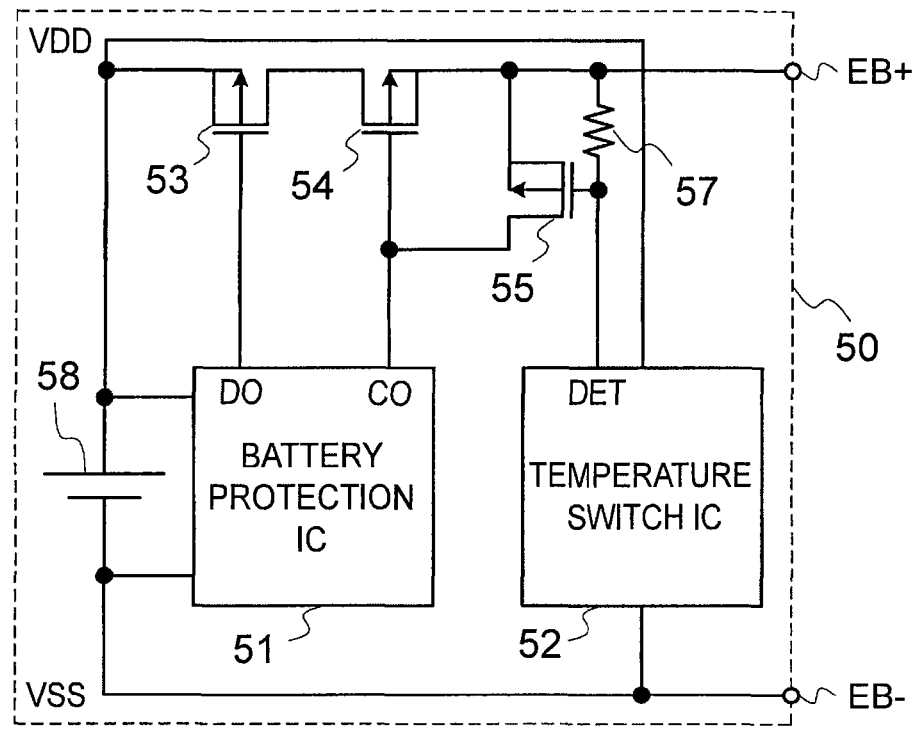
FIG. 4 is a block diagram illustrating a battery pack.
Figure 5:
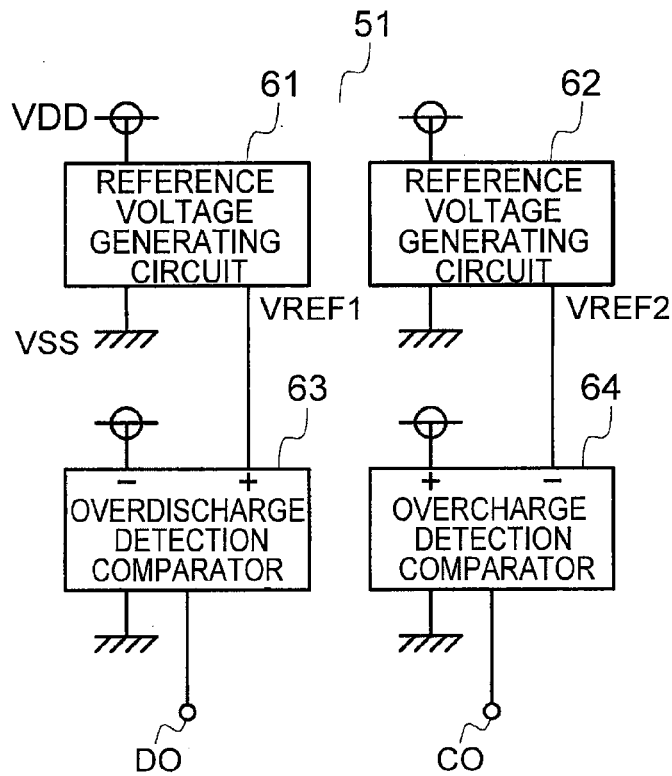
FIG. 5 is a block diagram illustrating a battery protection IC.
Figure 6:
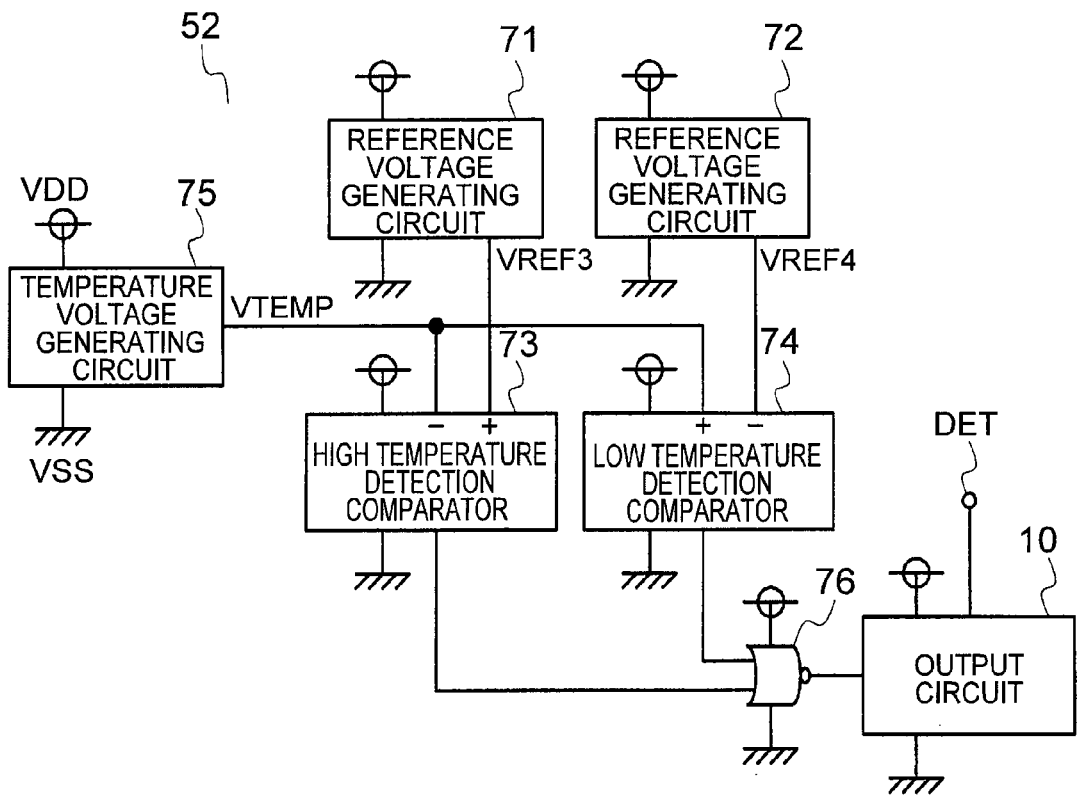
FIG. 6 is a block diagram illustrating a temperature switch IC.
Figure 7:
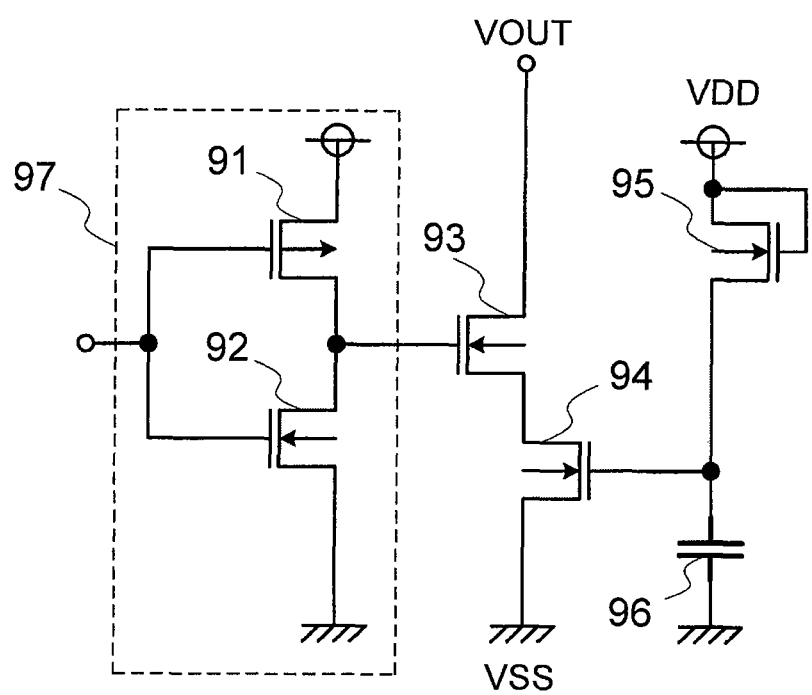
FIG. 7 is a circuit diagram illustrating a conventional output circuit.

An application example of the output circuit 10 will now be described. First, the construction of a temperature switch IC provided with the output circuit 10 and the construction of a battery pack provided with a battery protection IC will be described. The temperature switch IC detects an abnormal temperature. The battery protection IC protects a battery from overcharge/overdischarge. FIG. 4 is a block diagram illustrating the battery pack. FIG. 5 is a block diagram illustrating the battery protection IC. FIG. 6 is a block diagram illustrating the temperature switch IC.

As illustrated in FIG. 4, a battery pack 50 includes a battery protection IC 51, a temperature switch IC 52, p-type FETs 53 to 55, a resistor 57, and a battery 58. Further, the battery pack 50 has an external terminal EB+ and an external terminal EB−.

As illustrated in FIG. 5, the battery protection IC 51 includes reference voltage generating circuits 61 and 62, an overcharge detection comparator 64, and an overdischarge detection comparator 63. Further, the battery protection IC 51 has a supply terminal, an earth terminal, a charge control terminal CO, and a discharge control terminal DO.

As illustrated in FIG. 6, the temperature switch IC 52 has a temperature voltage generating circuit 75, reference voltage generating circuits 71 and 72, a high temperature detection comparator 73, a low temperature detection comparator 74, a NOR circuit 76, and an output circuit 10. The temperature voltage generating circuit 75 is constituted of a PNP bipolar transistor and the like, although not shown. Further, the temperature switch IC 52 has a supply terminal, an earth terminal, and an output terminal DET.

The supply terminal of the battery protection IC 51 is connected to the positive terminal of the battery 58, the earth terminal thereof is connected to the negative terminal of the battery 58, the discharge control terminal DO is connected to the gate of the p-type FET 53, and the charge control terminal CO is connected to the gate of the p-type FET 54 and the drain of the p-type FET 55. The supply terminal of the temperature switch IC 52 is connected to the positive terminal of the battery 58, the earth terminal thereof is connected to the negative terminal of the battery 58, and the output terminal DET thereof is connected to the gate of the p-type FET 55.

The resistor 57 is provided between the external terminal EB+ and the connection point of the output terminal DET and the gate of the p-type FET 55. The source and the back gate of the p-type FET 53 are connected to the positive terminal of the battery 58, and the drain thereof is connected to the drain of the p-type FET 54. The source and the back gate of the p-type FET 54 are connected to the external terminal EB+. The source and the back gate of the p-type FET 55 are connected to the external terminal EB+. The external terminal EB− is connected to the negative terminal of the battery 58. In other words, the p-type FETs 53 and 54 are provided in series in the charge/discharge path of the battery 58.

The reference voltage generating circuits 61 and 62, the overcharge detection comparator 64, and the overdischarge detection comparator 63 are provided between the supply terminal and the earth terminal. The inverting input terminal of the overcharge detection comparator 64 is connected to the output terminal of the reference voltage generating circuit 62, the non-inverting input terminal thereof is connected to the supply terminal, and the output terminal thereof is connected to the charge control terminal CO. The inverting input terminal of the overdischarge detection comparator 63 is connected to the supply terminal, the non-inverting input terminal thereof is connected to the output terminal of the reference voltage generating circuit 61, and the output terminal thereof is connected to the discharge control terminal DO.

The reference voltage generating circuits 71 and 72, the high temperature detection comparator 73, the low temperature detection comparator 74, the temperature voltage generating circuit 75, the NOR circuit 76, and the output circuit 10 are connected between the supply terminal and the earth terminal. The non-inverting input terminal of the high temperature detection comparator 73 is connected to the output terminal of the reference voltage generating circuit 71, while the inverting input terminal thereof is connected to the output terminal of the temperature voltage generating circuit 75. The non-inverting input terminal of the low temperature detection comparator 74 is connected to the output terminal of the temperature voltage generating circuit 75, while the inverting input terminal thereof is connected to the output terminal of the reference voltage generating circuit 72. The first input terminal of the NOR circuit 76 is connected to the output terminal of the high temperature detection comparator 73, the second input terminal thereof is connected to the output terminal of the low temperature detection comparator 74, and the output terminal thereof is connected to the input terminal of the output circuit 10. The output terminal of the output circuit 10 is connected to the output terminal DET.

Upon detection of an abnormal temperature, the temperature switch IC 52 emits an output current. The resistor 57 generates a voltage on the basis of the output current. The voltage generated in the resistor 57 turns the p-type FET 55 on. This causes the p-type FET 54 for charge control to turn off, thus controlling charge. If the battery 58 is overcharged, then the battery protection IC 51 operates to turn the p-type FET 54 off. If the battery 58 is overdischarged, then the battery protection IC 51 operates to turn the p-type FET 53 for discharge control off.

The operation of the battery pack 50 will now be described.
[Operation Performed when the Battery 58 is Overcharged]

A charger (not shown) is connected to the battery pack 50. The reference voltage generating circuit 62 generates a reference voltage VREF2 based on an overcharge voltage indicating that the battery 58 is in an overcharged state. The overcharge detection comparator 64 compares a divided voltage of the voltage of the battery 58 with the reference voltage VREF2, and reverses an output voltage according to the comparison result. More specifically, if the divided voltage of the voltage of the battery 58 exceeds the reference voltage VREF2, then the output voltage of the overcharge detection comparator 64 is reversed to a high level. This turns the p-type FET 54 off, stopping the charging of the battery 58.

[Operation Performed when the Battery 58 is Overdischarged]

A load (not shown) is connected to the battery pack 50. The reference voltage generating circuit 61 generates a reference voltage VREF1 based on an overdischarge voltage indicating that the battery 58 is in an overdischarged state. The overdischarge detection comparator 63 compares a divided voltage of the voltage of the battery 58 with the reference voltage VREF1, and reverses an output voltage according to the comparison result. More specifically, if the divided voltage of the voltage of the battery 58 drops to the reference voltage VREF1 or lower, then the output voltage of the overdischarge detection comparator 63 is reversed to a high level. This turns the p-type FET 53 off, stopping the discharging of the battery 58.

[Operation in Case of Abnormally High Temperature]

The temperature voltage generating circuit 75 generates a temperature voltage VTEMP based on a temperature. The temperature voltage generating circuit 75 is characteristic in that the temperature voltage VTEMP drops as the temperature rises. The reference voltage generating circuit 71 generates a reference voltage VREF3 based on an abnormally high temperature to be detected. The high temperature detection comparator 73 compares the temperature voltage VTEMP with the reference voltage VREF3 and reverses the output voltage according to the comparison result. More specifically, as the temperature rises, the temperature voltage VTEMP drops, and the output voltage of the high temperature detection comparator 73 switches to a high level when the temperature voltage VTEMP drops to the reference voltage VREF3 or less. In other words, if the temperature reaches an abnormally high temperature level or more, then the output voltage of the high temperature detection comparator 73 is switched to the high level. As a result, the output voltage of the NOR circuit 76 is set to a low level, the output circuit 10 is turned on to supply current to the resistor 57, a voltage is generated at the resistor 57, and the voltage of the output terminal DET is set to the low level. This causes the p-type FET 55 to turn on and the p-type FET 54 to turn off, thus stopping the charging of the battery 58.

[Operation in Case of Abnormally Low Temperature]

The reference voltage generating circuit 72 generates a reference voltage VREF4 based on an abnormally low temperature to be detected. The low temperature detection comparator 74 compares the temperature voltage VTEMP with the reference voltage VREF4 and reverses the output voltage according to the comparison result. More specifically, as the temperature decreases, the temperature voltage VTEMP rises, and the output voltage of the low temperature detection comparator 74 switches to a high level when the temperature voltage VTEMP reaches the reference voltage VREF4 or more. In other words, if the temperature decreases to an abnormally low temperature level or less, then the output voltage of the low temperature detection comparator 74 is switched to the high level. This causes the charging of the battery 58 to be stopped as described above.

Thus, the operation of the aforementioned output circuit 10 ensures that the output circuit 10 of the temperature switch IC 52 always turns off if the power supply voltage VDD is lower than the minimum operating power supply voltage of the output circuit 10. As a result, the voltage at the output terminal of the output circuit 10, i.e., the voltage at the output terminal DET of the temperature switch IC 52 is invariably pulled up to the voltage at the external terminal EB+ by the resistor 57. Hence, if the power supply voltage VDD is lower than the minimum operating power supply voltage of the output circuit 10, the p-type FET 55 invariably turns off, thereby invariably disabling the temperature switch IC 52 to control the p-type FET 54 through the intermediary of the p-type FET 55. Accordingly, when, for example, the charging of the battery 58 is started from a state wherein the voltage thereof is in the vicinity of zero volt, it is possible to prevent the temperature switch IC 52 from malfunctioning to turn the p-type FET 54 off due to the low voltage (power supply voltage VDD) of the battery 58 and erroneously stopping the charging despite that the voltage of the battery 58 is low.

As illustrated in FIG. 6, the overcharge detection comparator 64 and the overdischarge detection comparator 63 are required as the protective functions for the battery pack 50. However, in the case where the specifications of the battery pack 50 do not require the overdischarge detection function as the protective function, the overdischarge detection comparator 63 may be deleted, although not shown. In this case, the p-type FET 53 would be also deleted.

Further, illustrated in FIG. 6, the high temperature detection comparator 73 and the low temperature detection comparator 74 are required as the protective functions for the battery pack 50. However, in the case where the specifications of the battery pack 50 do not require the low temperature detection function or the high temperature detection function as the protective function, the low temperature detection comparator 74 or the high temperature detection comparator 73 may be omitted.

Further, the resistor 57, the p-type FET 55 or the like may be incorporated in the temperature switch IC 52.

In FIG. 4, the p-type FETs 53 and 54 for controlling charge/discharge are provided between the external terminal EB+ and the positive terminal of the battery 58. Alternatively, however, two n-type FETs may be provided between the external terminal EB− and the negative terminal of the battery 58, although now shown. In this case, the p-type FET 55, the resistor 57, the internal circuit of the battery protection IC 51, and the internal circuit of the temperature switch IC 52 would be changed, as necessary.

In FIG. 4, the temperature switch IC 52 controls only the p-type FET 54 for charge control. Alternatively, however, the temperature switch IC 52 may control only the p-type FET 53 for discharge control, although not shown, or may control both the p-type FETs 53 and 54.

What is claimed is:

1. An output circuit with open-drain output comprising:
    an inverter circuit connected to an input terminal of the output circuit;
    an output MOS transistor having a gate thereof connected to an output terminal of the inverter circuit, a drain thereof directly connected to an output terminal of the output circuit, and a source thereof connected to a first supply terminal;
    a switch circuit between the inverter circuit and a second supply terminal; and
    a current source connected to an output of the inverter circuit between the gate of the output MOS transistor and the first supply terminal,
    wherein the switch circuit turns off when a power supply voltage is lower than a minimum operating voltage of the output circuit.

2. The output circuit according to claim 1,
    wherein the switch circuit comprises an MOS transistor having a gate thereof connected to the first supply terminal, and
    the minimum operating voltage comprises an absolute value of a threshold voltage of the MOS transistor.

3. The output circuit according to claim 2,
    wherein the switch circuit further comprises a second current source and a second MOS transistor connected in series between the first supply terminal and the second supply terminal, and
    a connection node of the second current source and the second MOS transistor is connected to the gate of the MOS transistor, and
    the minimum operating voltage comprises a total voltage of the absolute value of the threshold voltage of the MOS transistor and an absolute value of the threshold voltage of the second MOS transistor.

4. A temperature switch IC comprising:
    a temperature voltage generating circuit which generates a temperature voltage based on a temperature;

a reference voltage generating circuit which generates a reference voltage corresponding to an abnormal temperature;

a comparator which compares the temperature voltage with the reference voltage and reverses an output voltage according to a comparison result; and the output circuit according to claim 1, which is connected to an output terminal of the comparator.

5. A battery pack having a battery and a battery protection IC that controls charge/discharge of the battery, comprising:

a charge control FET provided in a charge/discharge path of the battery; and a temperature switch IC according to claim 4, which detects an abnormal temperature;

wherein the charge control FET is turned off in the case where the temperature switch IC detects an abnormal temperature.

* * * * *